United States Patent
Cotteleer et al.

(10) Patent No.: US 11,398,073 B2
(45) Date of Patent: Jul. 26, 2022

(54) METHOD TO FACILITATE MASS CONVERSION OF 2D DRAWINGS TO 3D MODELS

(71) Applicant: Draawn, LLC, Camarillo, CA (US)

(72) Inventors: James Cotteleer, Camarillo, CA (US); Mark Cotteleer, Franklin, WI (US)

(73) Assignee: Draawn, LLC, Camarillo, CA (US)

( * ) Notice: Subject to any disclaimer, the term of this patent is extended or adjusted under 35 U.S.C. 154(b) by 106 days.

(21) Appl. No.: 16/909,675

(22) Filed: Jun. 23, 2020

(65) Prior Publication Data

US 2021/0398348 A1    Dec. 23, 2021

(51) Int. Cl.
*G06T 17/10*        (2006.01)
*G06F 30/20*        (2020.01)

(52) U.S. Cl.
CPC .............. *G06T 17/10* (2013.01); *G06F 30/20* (2020.01); *G06T 2219/024* (2013.01)

(58) Field of Classification Search
None
See application file for complete search history.

(56) References Cited

U.S. PATENT DOCUMENTS

| | | | | |
|---|---|---|---|---|
| 6,515,659 B1 * | 2/2003 | Kaye | ........................ | G06T 17/20 345/419 |
| 8,818,081 B1 * | 8/2014 | Lookingbill | ............ | G06T 15/10 382/154 |
| 11,087,543 B1 * | 8/2021 | Cowburn | ................. | H04L 67/16 |
| 2002/0004710 A1 * | 1/2002 | Murao | ..................... | G06F 30/00 702/167 |
| 2009/0284527 A1 * | 11/2009 | Ofek | ........................ | G06T 19/00 345/420 |
| 2016/0232474 A1 * | 8/2016 | Zou | ................. | G06Q 10/063112 |
| 2018/0137390 A1 * | 5/2018 | Brundage | ............ | G06K 9/6271 |
| 2019/0102815 A1 * | 4/2019 | Norman | ................. | G06Q 30/06 |
| 2021/0133604 A1 * | 5/2021 | Neumann | ................. | G06N 5/04 |
| 2021/0353248 A1 * | 11/2021 | Chung | ...................... | G01F 9/00 |

* cited by examiner

*Primary Examiner* — Jason A Pringle-Parker
(74) *Attorney, Agent, or Firm* — Ferguson Case Orr Paterson LLP

(57) ABSTRACT

An internet or cloud-based system, method, or platform ("platform") used to facilitate the conversion of electronic two-dimensional drawings to three-dimensional models. A group of people ("crowd") that has been found qualified to make such conversions, are selected for the conversion. The two-dimensional drawings are transmitted to the crowd for conversion to three-dimensional models. In some embodiments, multiple instances of the same two-dimensional drawings (or image data) is sent to multiple, independent crowd members in order that multiple versions of the same three-dimensional model can be created. Once the models are complete and returned, they are compared to each other on multiple features or characteristics. If two or more three-dimensional models are found to match within the prescribed tolerances, they are determined to be an accurate representation of the product or device shown in the two-dimensional drawings.

18 Claims, 4 Drawing Sheets

METHOD TO FACILITATE MASS CONVERSION OF 2D DRAWINGS TO 3D MODELS

This application claims the benefit of U.S. Provisional Patent Application Ser. No. 62/865,705, filed on Jun. 24, 2019.

BACKGROUND OF THE INVENTION

Field of the Invention

This invention relates to the conversion of drawings, and in particular to a cost efficient, safe and reliable conversion of two-dimensional drawings to three-dimensional models.

Description of the Related Art

Business and governmental organizations, such as the armed services, are finding it increasingly necessary to convert engineering and other drawings from two-dimensional ("2D") "flat" illustrations to three-dimensional (3D) models. In fact, most new drawings today are created in 3D. This is because 3D drawings facilitate a number of important features for the modern manufacturing, distribution, and service organization. These include (but are not limited to):

Facilitating for local and distributed manufacturing (e.g., 3DP);

Pursuing inventory optimization; Facilitating SKU rationalization;

Enabling online cataloging; Enhancing attribute search;

Facilitating machine code (e.g., CNC and additive manufacturing) generation; and Facilitating smart inspection protocols.

Unfortunately, a large number (many millions) of engineering and other drawings are currently "trapped" in 2D. There are several reasons for this.

One is that engineering service organizations, internal to organizations, lack the capacity to convert extant drawings from 2D to 3D, because they are challenged to address other, presumably higher priority, initiatives (e.g., new product development). The certification of drawings, once converted by traditional means (e.g., a single engineering interpreting and modeling in 3D) is fraught with error. External engineering services organizations that specialize in 2D to 3D conversion also lack the scale to convert a large number of drawing quickly, are prohibitively expensive, are susceptible to the same quality checking errors as internal engineering services organizations. These services often draw upon labor pools (e.g., non US national) that may raise security and/or intellectual property concerns for the customer organization.

What is needed is an efficient, scalable, and secure systems and methods to facilitate mass conversion of a large number of 2D drawings to 3d drawings or modes. The systems and method can be completed and elevated level of confidence in the quality of those conversions deemed to be "correct" and with strong controls on the population of technicians performing the actual 2D to 3D conversion,

SUMMARY OF THE INVENTION

The present inventions is generally directed to an internet or cloud based system, method, or platform ("platform") that is used to facilitate a group of people ("crowd") to be matched with 2D drawings that they then convert the drawings into 3D models. In some embodiments, multiple instances of the same 2D drawings or data is sent to multiple, independent crowd members in order that multiple versions of the same 3D model can be created. Once the models are complete, they are compared to each other on multiple factors. If two or more 3D models are found to match within the prescribed tolerances, they are determined to be an accurate representation of the 2D data.

Quality is managed through the cumulative number of 2D conversions created for each initial drawing and is based on an understanding of "first pass quality" for the underlying crowd. Crowd member diligence (and therefore performance) is promoted through a variety of performance-based incentives, including bonuses, and/or the opportunity for future conversion opportunities (each conversion is a "one off" agreement for services).

Customers may engage with the platform via a mass upload or other submission of a large number of drawings, or through a smaller (as little as one) number of individual drawing uploads. Level of anonymity as to 2D drawing source is variable based on customer wants and needs.

These and other further features and advantages provided in this disclosure would be apparent to those skilled in the art from the following detailed description, taken together with the accompanying drawings.

DETAILED DESCRIPTION

The present invention is generally directed to systems, methods and platforms ("platform") to facilitate the use of a pool of independent contractors ("crowd") working remotely via an internet based platform that can serve the 2D images and offer 3D CAD modeling tools for the crowd to accomplish the conversion. The conversion itself involves translating the dimensions and other data found in the 2D image data and creating a 3D model that matches that data using the provided internet-based tools.

The present invention is described herein with reference to certain embodiments and features, but it is understood that the invention can be embodied in many different forms and should not be construed as limited to the embodiments set forth herein. In particular many internal components of the platform and corresponding systems and methods according to the present invention can be arranged in many different ways and different embodiments can comprise different steps performed in different ways and in different order.

Embodiments of the present platform invention can comprise many different hardware and software components that work together to perform the conversions according to the present invention. As mentioned above, the system can be easily scalable because the platform is delivered digitally to a crowd over the digital communication network, such as the internet or in the cloud. Individual instances of 2D drawing or image data can be replicated as many times as necessary to meet the demands of the particular conversion project, such as the number of members desired in the crowd. Additionally, because the platform does not rely on a high level of competence of an individual crowd member, it is possible to have a significantly larger crowd that would be possible under traditional practices.

The present invention is also readily scalable and the capability of the service/process can expand to a great degree without substantively increasing the underlying cost structure involved. This means that the system becomes more cost efficient as it grows. This is decidedly untrue when it comes to competing approaches, which rely on linear growth in the number of people and software licenses etc. needed to expand services.

Figure 1:
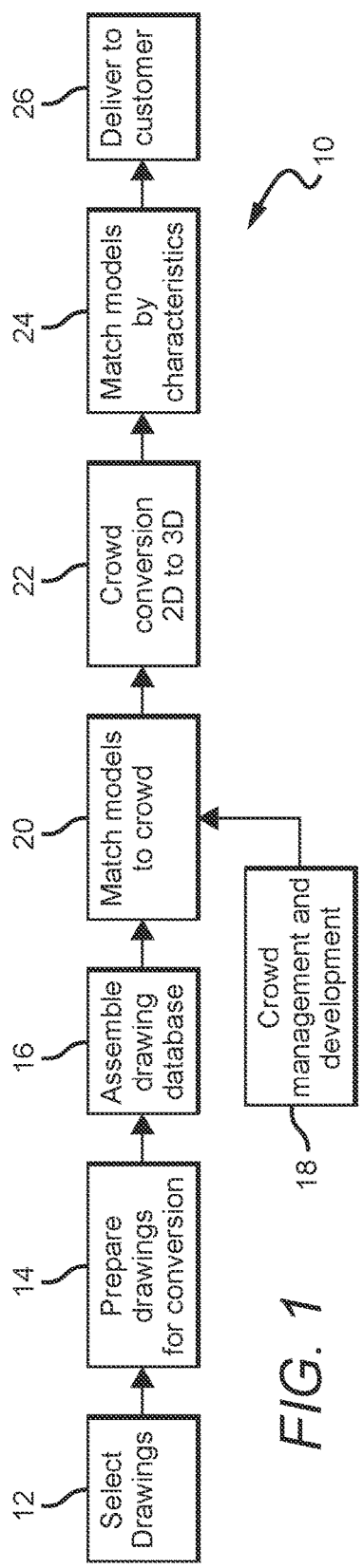
FIG. 1 shows one embodiment of the process flow used in different embodiments of platforms and systems according to the present invention wherein the 2D data is provided to the crowd, and through which resulting 3D models are received, verified, and held in a repository.

Embodiments of technology platforms that enable the innovation can take a variety of forms, using a variety of different technical devices and systems. FIG. 1 shows the one embodiment of a platform process or system flow 10 for converting 2D image data to 3D models. The present invention is largely a computer and software-based management solution that can be implemented in a variety of formats. One of the suitable modes would be to utilize a software-based solution that manages the distribution and collection of data and algorithmically matches the data using the characteristics described. Different embodiments of the present invention can be used to convert pools of 2D data into accurately matching 3D model for use by corporations, individuals, government organizations and various other institutions.

In step 12 of FIG. 1, the entity running the platform selects the particular drawings for conversion. This can be done based on certain factors such as customer requests, subject matter of the drawings, randomizing the drawings for security. etc. These are only some of the factors that might be relied upon in selecting the drawings for conversion.

In step 14, the selected drawings are prepared for conversion. This can require converting hard copies to the appropriate electronic version or converting already electronic version to another format. 2D drawings may be presented, as input to the conversion process, in any of a variety of different formats, including JPEG, PDF, hand drawn, paper based, png, tif, mp3/4, bmp, and others. The purpose can be to visually communicate the design and dimension of 2D drawings to be converted.

In step 16, the drawing database is assembled. Different embodiments of the present invention can depend on the use of Drawing Server software to securely deliver 2D drawings to the crowd member. This software may initially rely on FTP, Email, and/or cloud-based delivery mechanisms (e.g., Dropbox) but can also evolve to include automated drawing selection and delivery systems as the platform evolves.

In some embodiments, the identity of the client submitting the 2D image date for conversion can be protected. This can be done for a number of reasons, with one example being the protection of intellectual property. In these instances, only of a portion of the client's protected product can be submitted for conversion, which can leave the crowd member unsure of the remainder of the product. This will help protect to IP to the overall product while still allowing for conversion of a portion.

Additionally, the process can be capable of removing the customer's identifying data from the 2D data prior to viewing by the crowd. Alternatively, it is also possible to obscure customer identity information from the 2D image data using commercially available document editing tools. This can be done before the information is sent to the crowd for conversion, thereby the submitting party's anonymity is enhanced.

In addition, in most embodiments the member of the crowd making the conversion would be working across many customers on the platform. It would be highly unlikely, that the crowd member {or other unauthorized person} would have sufficient information to infer that a series of 2D images or part designs might come from the same customer (or source). As an added layer of protection, platforms according to the present invention can specifically prevent (through a process of tracking which part designs go where) the same authorized crowd member from seeing too many part designs from the same source.

Referring again to FIG. 1, in step 18 the platform performs crowd management and development. Under this step, different embodiments of the present invention can focus on secure identification and validation of crowd member identities. Such systems may reasonably include two-step, password protected, and/or biometric measures to clearly identify and credit crowd members with work.

In some embodiments, in order for a crowd member to participate in the conversion opportunities provided by the platform, the crowd member must go through a verification similar to the hiring process for in person employment. This process can include verification that the member is qualified to make the 2D to 3D conversion and the submission of "Personally Identifiable Information" by the crowd member including, but not limited to, forms I-9, W-9, Social Security number, and banking information. To further ensure that the platform is not accessible by an unknown crowd member, "Two Factor Authentication" can also be required to log in to the platform.

In step 20, the drawings to be converted are matched to the appropriate members of the crowd. This matching can be based on many factors, such as subject matter of the drawings, qualifications of the crowd member, aptitude of the crowd member, etc. It is understood that these are only some of the many factors that can be relied upon. Alternatively and when specific criteria are not as important, the members can be randomly selected.

For many customers, it can also be important that the conversion work be done in a specific geographic location or area. For example, certain government work may have the requirement that certain work be done on that government's locale. In some embodiments, this can be achieved by a combination of crowd member selection, utilizing information gleaned from the crowd member hiring process as well as the location of the crowd member's IP address. The two forms of information, used together, can provide a high level of certainty that the crowd member is in the location claimed. In some embodiments, this certainty can be 80% or higher, while in other embodiments it can be 90% or higher. System access and activity may also be constantly monitored, using IP addresses, for example, to identify location of the crowd member to prevent unauthorized access based on geographical constraints.

Figure 2:
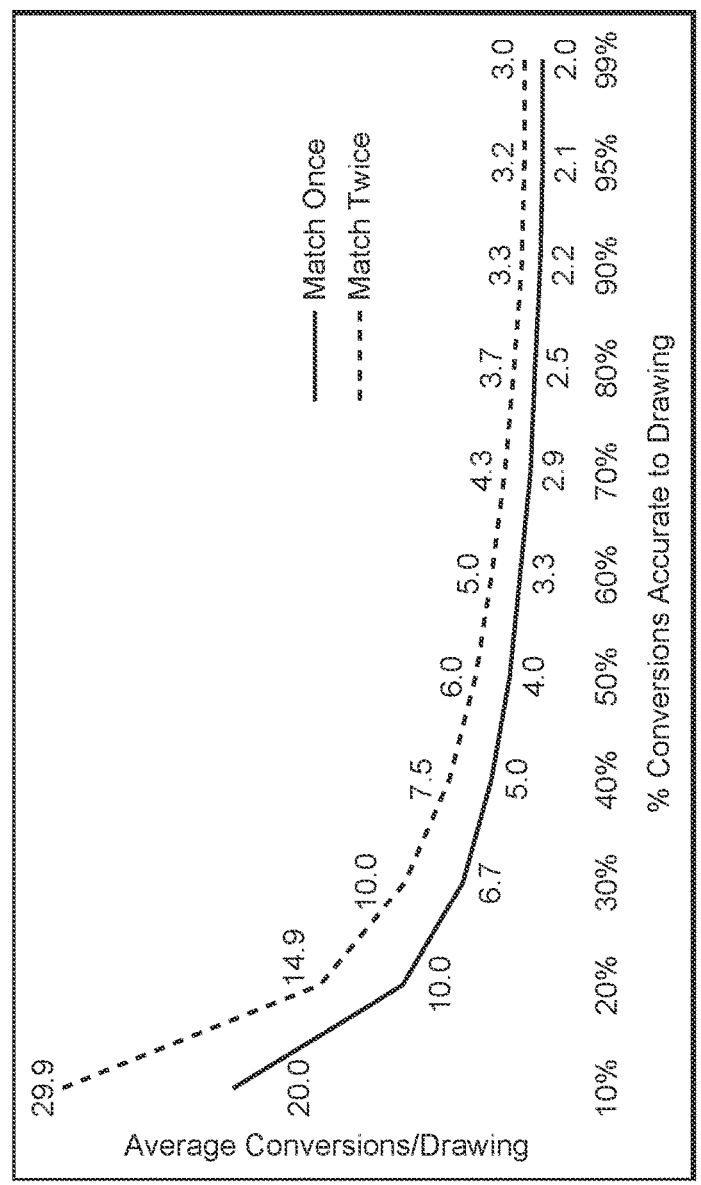
FIG. 2 shows one embodiment of mathematical modeling that allows the conversion facilitator the ability to predict and manage the expected number of drawing-to-model attempts required in order to successfully create a matched (and therefore "correct") conversion. The model provides illustrations of both "single" match (two models match one another) and "double" match (three models match one another) in order to increase the level of certainty around the correctness of the models.

It is understood that the crowd can comprise many different numbers of members depending on the conversion job to be completed. The numbers can be as low as 2, and as high as many thousands or tens of thousands or more. FIG. 2 shows modeling that can be used to predict and manage the expected number of drawing-to-model attempts required in order to successfully create a matched (and therefore "correct") conversion. This type of modeling can be useful in determining the number of crowd members desired during the match.

Figure 3:
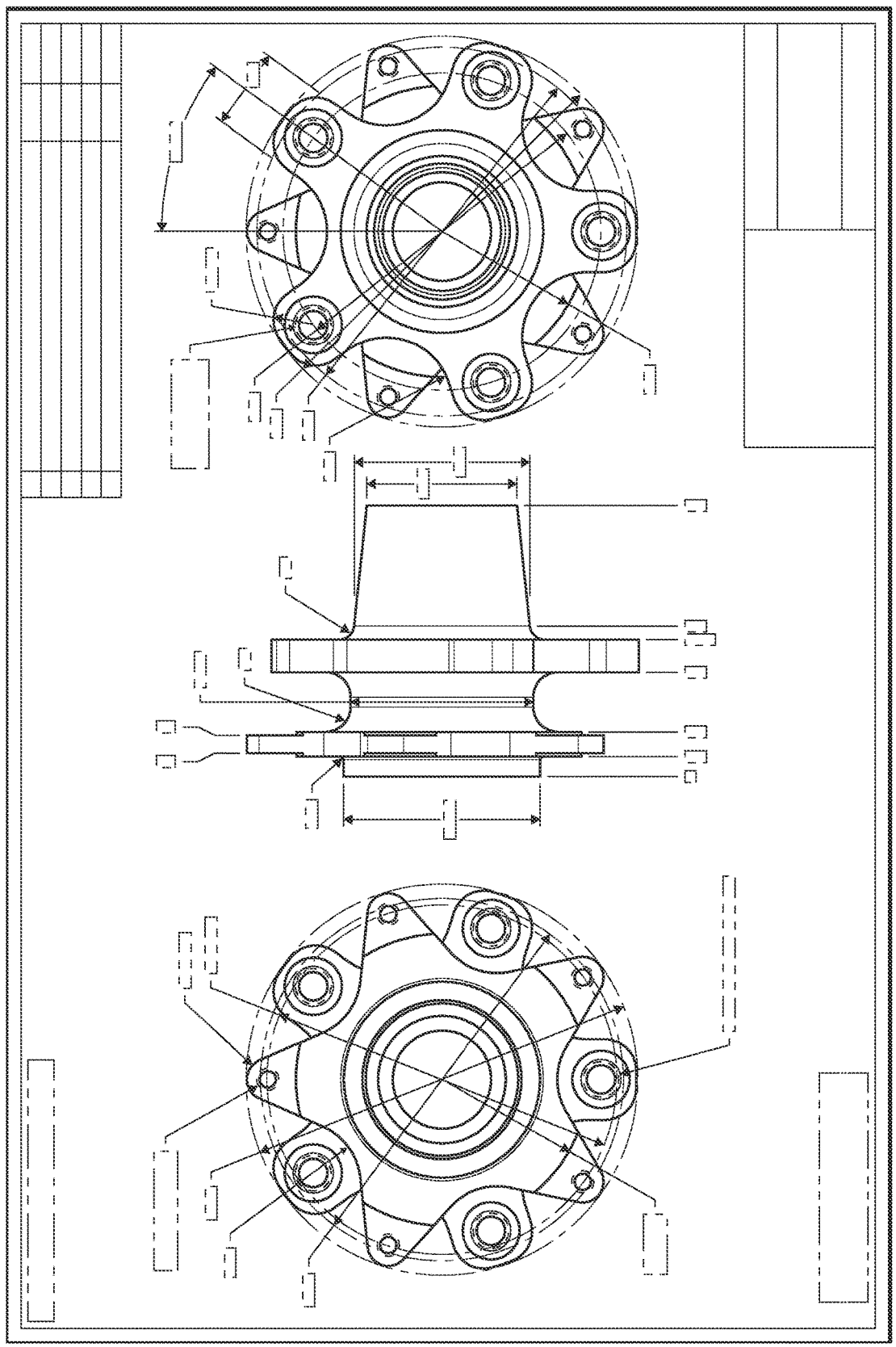
FIG. 3 shows one example of two-dimensional (2D) image drawings showing different views if a device/product that might be provided to a crowd member for conversion to a 3D model.
Figure 4:
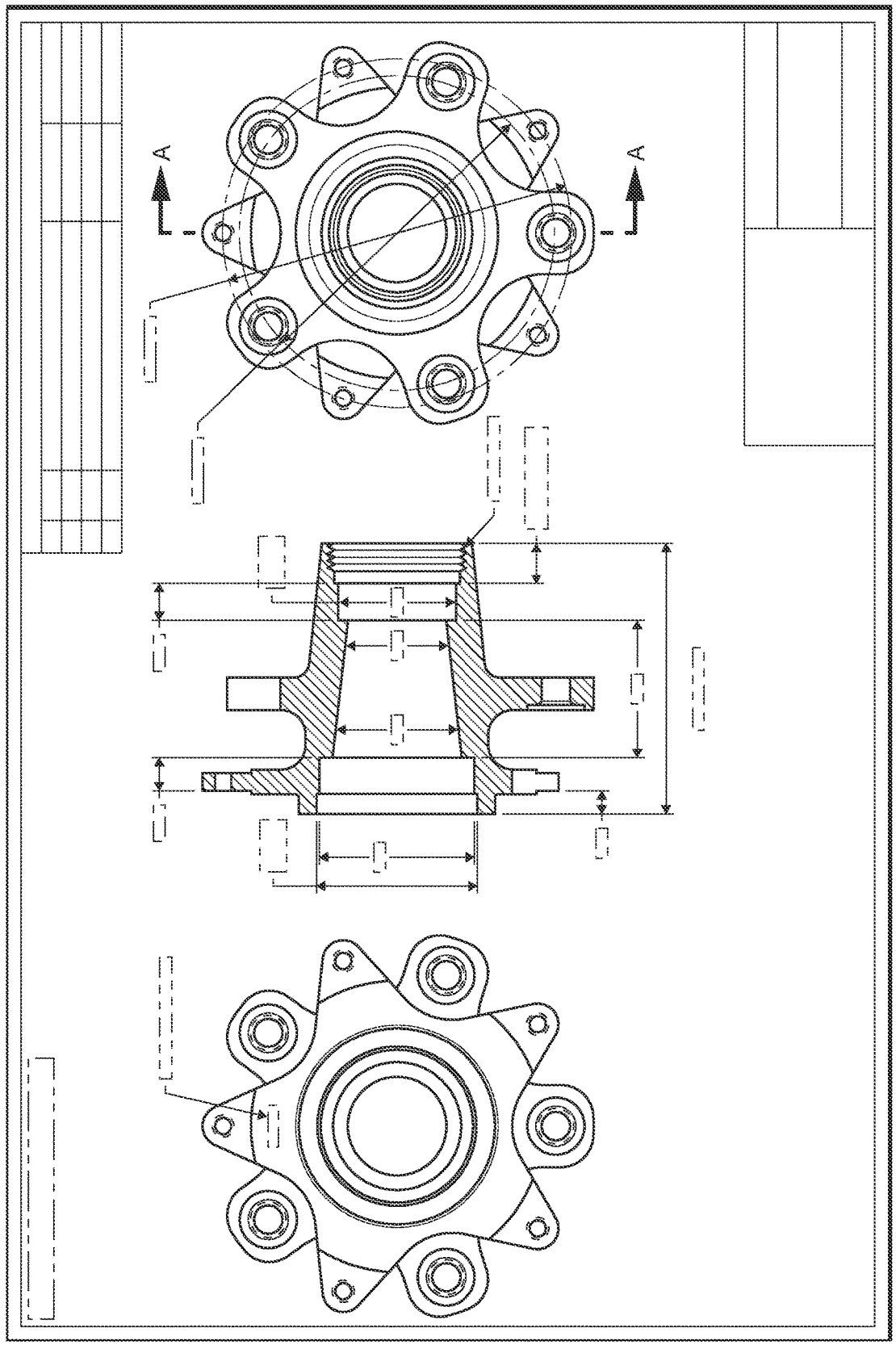
FIG. 4 show additional 2D drawings of the device/product shown in FIG. 3 that might also be provided to a crowd member for conversion to a 3D model.
Figure 5:
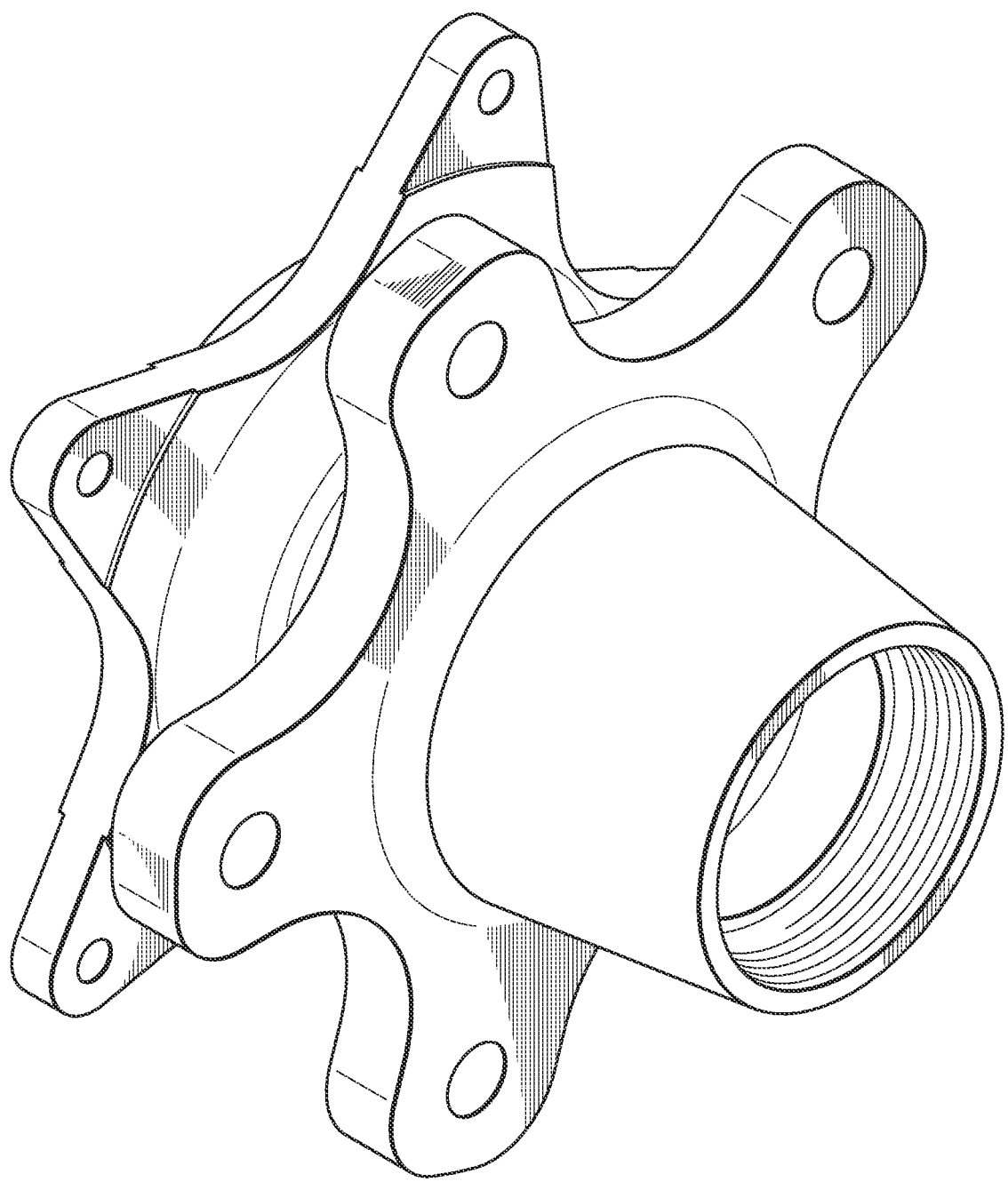
FIG. 5 shows one embodiment of a 3D model following conversion by the crowd member from the 2D drawings shown in FIGS. 3 and 4.

In step 22, the crowd converts the 2D drawings (image data) to a 3D model. FIGS. 3 and 4 show only on example of 2D image drawings that might be provided to a crowd member for conversion to a 3D model. FIG. 5 shows one embodiment of a 3D model following conversion by the crowd member from the drawing shown in FIGS. 3 and 4.

Different embodiments of the present invention may deploy any of number of different software systems that are typically used in the creation of 3D models. They may include brand names such as AutoCad, Creo, NX, Solid Edge, Inventor, Catia, and others. These systems can be used to create 3D models from 2D drawings, presented to the crowd member in 2D or other format. The present invention does not depend on the use of any particular CAD program, but rather the combination of uses developed in the process. Upon completion of the 3D model, it and the 2D data can be stored together on the platform in anticipation of further processing/validation.

The platforms according to present invention that are internet (or cloud) based platform present the possibility to completely restrict the crowd from saving or downloading either the 2D data or the created 3D model. In some embodiments, the platform is delivered digitally over a network, such as the internet, and the software does not reside on a computer controlled by the crowd. As such, the platform can be configured to only save 2D image data or 3D models to a secure computer, server, or site, controlled by the platform. This arrangement can allow for configuration that prevents the crowd member from saving files to their local computers. This same downloading restriction can also be achieved by requiring the crowd member to run the platform in "virtual machine", thereby breaking the link between the platform and the crowd member's local computer. In still other embodiments where needed a higher degree of security, the platform can employ a system scan to require and verify that no local storage device is connected to the crowd member's computer, thus confirming that the crowd member does not have the capability to download and save any images or models.

Referring now to step 24, once the 3D models are complete (two or more based on desire) they can be compared to each other to determine if there is a match between the models. Different embodiments of the present invention can incorporate various systems to compare and/or differentiate the dimensions and other key model characteristics of converted models. The purpose of these and other comparative measures can be to determine if two or more models converted by the same or different crowd member represent a match sufficient to call the model "correct" (e.g., within specified tolerance). This comparison can focus on one or more of the following characteristics or methods including, but not limited to, dimension, weight, mass, center of mass, moment of inertia, volume, axis of rotation or other characteristics commonly known or that may become known in the future. This can be accomplished either by a human or by an automated system. The process of comparing the models can be completed by different methods such as manual or automatic direct overlay. If the models are deemed not to match, additional instances can be sent to the crowd for conversion with that result being matched to the prior completed instances until two 3D models (or more based on desire) are found that match within the tolerances specified.

As described above, the 3D models independently completed by the members of the crowd are compared to determine if there is a "match". The degree to which the 3D models match provides the corresponding level of confidence to the accuracy of the two conversions. The platform determines the acceptable tolerance through analysis of the initial 2D image data. In most instances, the 2D drawing or image data specifies the acceptable tolerances, either explicitly in the dimensions, or implicitly via a note in the title block. The platform can then use this to set acceptable variation limits to determine a match for two 3D models. Furthermore, based on the calculated physical properties of a completed model, the platform will adjust the tolerance band to ensure that a match is reasonable and accurate.

By way of example, a low mass or volume part with a "loose" tolerance band as derived from the 2D image data, may have a 1% variation in mass between two models and still provide an acceptable match. By contrast, for a high mass/volume part with a tighter tolerance band, a 1% discrepancy would not be acceptable.

Given that there are infinite ways to incorrectly model the 2D drawing or image date, and only one way to model it correctly, and given the fact that the chances of two un-related parties making the same mistake in the exact same way are small; two or more (depending on customer needs) matching 3D models derived from the same 2D data are deemed to be an accurate 3D representation of the 2D data.

As described in more detail below, it is anticipated that different embodiments of the present invention can incorporate various aspects of artificial intelligence and/or machine learning, and other advance analytic and statistical techniques (AI/ML/AA) to better "learn" what is entailed in a match, and to advise crowd members on those elements of a drawing that represent particularly error prone conversion challenges. It is also anticipated that similar AI/ML/AA tools can be deployed to help crowd members validate their own work prior to submission, thus facilitating more rapid correct model completion.

In step 26, when a match is found the 3D model is delivered to the customer. Alternatively, the customer can have access to the platform to access the converted 3D models when desired. Additionally, a customer may upload one or more drawings through a web portal for conversion and, upon completion, download the completed 3D model from the same web portal.

In addition to the above, the embodiment of platforms according to the present invention can also comprise crowd community support software. These can various software systems used to create a "community" among crowd members, such that incentives are created (e.g., badges, points, community status, etc.) to continue engagement in the community. Crowd members may be able to share desktops, spot check on another's work, and collaborate on the conversion of 2D to 3D models. The innovation foresees the creation of sub-communities or consortia, essentially teams of crowd members collaborating in the faster, better 2D/3D conversions. It is understood that members of the crowd can be compensated in many different ways such being paid for each conversion or being paid only when their conversion results in a match. In still other embodiment, the crown member could be charged a subscription fee (periodic or one-time) to remain part of the crowd considered for conversion assignments.

Different embodiments of the present invention can be used with many different hardware platforms or components. For members of the crowd, different embodiments of the present invention can work on a variety of local platforms, typically (though not necessarily) owned and operated by the crowd member. These may include any commonly used computing platforms, including desktop and laptop computers using any of a variety of operating systems (e.g., Windows, IoS, MacOS, Linex, Chrome, or others)

Different embodiments can also be tailored for a mobile experience, allowing crowd members to complete conversions using any of a variety of tablets, smart phones, or other mobile devices, running on a variety of operating systems (e.g., Android, IoS, Windows, and others).

In still other embodiments, the platform could be built on rapidly evolving "gamification" platforms that include deployment via popular gaming platforms (e.g., PS4, Xbox, Nintendo Switch, etc.). These embodiments can allow crowd members to individually and collaboratively execute conversions in typical and gaming/competitive contexts. These presentations may be offered in a variety of small/medium/large screen applications, as well as in various augmented and virtual reality formats.

It is also understood that Software and systems for the embodiments of the present invention may be supported, in whole or in part, on a variety of cloud-based platforms. These may include $3^{rd}$ party platform providers (e.g., Amazon Web Services, Microsoft Azure, etc.) as well as company maintained sites. Hosted systems may include those directly related to the innovation (e.g., CAD design, drawing presentation, model comparison, AI/ML/AA) and also enterprise systems used to integrate with, support, and run the innovation.

Elements of embodiments of the present invention may also be supported, in whole or in part, on local hardware owned/operated by the crowd member. Locally hosted systems may include those directly related to the innovation (e.g., CAD design, drawing presentation, model comparison, AI/ML/AA) and also integration systems used to support, and run the platform.

As mentioned above, systems according to the present invention can rely on artificial intelligence (AI), machine learning (ML) or advanced analytic (AA) systems in performing certain steps in the platforms according to the present invention. In some embodiments of the present invention, a variety of AA/ML/AA systems can be used to facilitate model comparison. Different embodiments may also deploy AI/ML/AA for the identification/validation and training of the crowd user community. Such systems may be utilized to detect behaviors consistent with IP risks (e.g., theft or other intentional misuse), skills development (e.g., identification of training needs, delivery of hints or tips), and analysis of drawing for common error identification.

Embodiments of the present invention can deploy AI/ML/AA for the visual and graphical analysis of 2D drawings, to identify relevant data for the conversion process, to validate the availability of all relevant dimensions, to analyze dimensional and other drawing inconsistencies, and to assess the overall difficulty and/or tractability of successful 2D/3D conversion.

AI/ML/AA can also be used for categorizing the drawing or scoring drawings for complexity. Observable attributes of drawings (e.g., number of corners, rounded surfaces, holes, fillets, etc.) may be recorded for each drawing and associated with quality and delivery outcomes in ways that allow new drawing to be categorized/scored for risk. This will facilitate allocation of more complex/risky drawing to more experienced or specialized member of the crowd. These tools can also be used to intelligently vary price offerings, in order to manage incentives for crowd members to take on risky drawings, or to save on more simple drawings.

The AI/ML/AA Cognitive tools may also be deployed to analyze observable attributes and behaviors of the crowd members (e.g., location, time of work, duration of work, patterns of website interaction) in order to detect fact and behavior patterns that may point to fraudulent and other undesirable behavior. Similarly, attributes and behaviors may also signal the existence of "best practices" that might be used to benefit the productivity and success of the broader crowd membership.

The AI/ML/AA cognitive tools can also be deployed against the models themselves in order to flag potential quality issues. For example, analysis of build trees may highlight overly complex (or simplified) approaches to conversion. Analysis of dimensioning data can help flag models that may require more or less of this documentation. Analysis of volume, mass, and other model attributes can be used to dynamically assign tolerances bands for what constitutes a successful pairing of models.

Although the present disclosure has been described in detail with reference to certain configurations thereof, other versions are possible. Therefore, the spirit and scope of the disclosure should not be limited to the versions described above. The foregoing is intended to cover all modifications and alternative constructions falling within the spirit and scope of the disclosure as expressed in the appended claims, wherein no portion of the disclosure is intended, expressly or implicitly, to be dedicated to the public domain if not set forth in the claims.

We claim:

1. A method for converting two-dimensional drawings to three-dimensional models, comprising:
   assembling electronic two-dimensional drawings of a device;
   selecting two or more members from a crowd to convert said two-dimensional device drawings to an electronic three-dimensional model;
   electronically transmitting said two-dimension drawings to said selected crowd members for conversion to said three-dimensional models;
   electronically receiving said three-dimensional models from two or more selected crowd members; and
   comparing said received three-dimensional models to determine if there is a match between the models within pre-determined feature tolerances.

2. The method of claim 1, wherein said match between said three-dimensional models comprises an indication of conversion accuracy.

3. The method of claim 1, where said feature tolerances can comprise one or more features from the group including dimension, weight, mass, center of mass, moment of inertia, volume and axis of rotation.

4. The method of claim 1, where said transmitting and receiving of said two-dimensional drawings and three-dimensional models is internet based.

5. The method of claim 1, wherein said transmitting and receiving of said two-dimensional drawings and three-dimensional models is cloud based.

6. The method of claim 1, wherein said comparison is done manually.

7. The method of claim 1, wherein said comparison is done by computer program stored in a non-transitory computer-readable medium.

8. The method of claim 1, wherein said selecting of said crowd members is based on pre-determined criteria.

9. The method of claim 8, wherein said criteria can be any one from the group comprising subject matter of the two-dimensional drawings, qualifications of the crowd member, aptitude of the crowd member and geographic location of the crowd member.

10. The method of claim 1, wherein said selecting of said crowd members is random.

11. A server implemented with a computer, the server comprising:
 at least one processor configured to execute a computer-readable instruction, wherein the at least one processor is configured to:
  select on or more two-dimensional drawings in electronic form for conversion;
  selecting two or more crowd members from a pool of previously approved conversion crowd members based on selected criteria;
  transmitting said two-dimensional drawings to said selected crowd members for conversion to electronic three-dimensional models;
  receiving said three dimensional models from at least two or more of said crowd members; and
  comparing said received three-dimensional models to determine if there is a match between the models within pre-determined feature tolerances.

12. The server implemented with a computer of claim 11, wherein said match between said three-dimensional models establishes conversion accuracy to said three-dimensional models.

13. The server implemented with a computer of claim 11, where said feature tolerances can comprise one or more features from the group including dimension, weight, mass, center of mass, moment of inertia, volume and axis of rotation.

14. The server implemented with a computer of claim 11, where said tolerances can vary depending on the characteristics of said features.

15. The server implemented with a computer of claim 14, wherein said characteristics comprise mass or volume.

16. The server implemented with a computer of claim 11, wherein said transmitting and receiving of said two-dimensional drawings and three-dimensional models is internet based.

17. The server implemented with a computer of claim 11, wherein said transmitting and receiving of said two-dimensional drawings and three-dimensional models is cloud based.

18. The server implemented with a computer of claim 11, wherein said selecting of said crowd members is based on pre-determined criteria.

* * * * *